United States Patent
Eun (10) Patent No.: US 8,592,326 B2
(45) Date of Patent: Nov. 26, 2013

(54) METHOD FOR FABRICATING AN INTER DIELECTRIC LAYER IN SEMICONDUCTOR DEVICE

(75) Inventor: Byung Soo Eun, Seoul (KR)

(73) Assignee: SK hynix Inc., Icheon-Si (KR)

( * ) Notice: Subject to any disclaimer, the term of this patent is extended or adjusted under 35 U.S.C. 154(b) by 1255 days.

(21) Appl. No.: 11/945,659

(22) Filed: Nov. 27, 2007

(65) Prior Publication Data

US 2009/0004849 A1    Jan. 1, 2009

(30) Foreign Application Priority Data

Jun. 28, 2007 (KR) .................. 10-2007-0064760

(51) Int. Cl.
*H01L 21/31* (2006.01)
(52) U.S. Cl.
USPC ................................................ 438/778
(58) Field of Classification Search
None
See application file for complete search history.

(56) References Cited

U.S. PATENT DOCUMENTS

| | | | | |
|---|---|---|---|---|
| 6,461,529 | B1* | 10/2002 | Boyd et al. ................. | 216/67 |
| 6,949,436 | B2* | 9/2005 | Buller et al. ................ | 438/303 |
| 2002/0055271 | A1* | 5/2002 | Lee et al. .................... | 438/782 |
| 2002/0064937 | A1* | 5/2002 | Kim et al. ................... | 438/623 |
| 2002/0064968 | A1* | 5/2002 | Kim et al. ................... | 438/782 |
| 2003/0008453 | A1* | 1/2003 | Kang et al. ................. | 438/239 |
| 2004/0092074 | A1* | 5/2004 | Mao et al. ................... | 438/305 |
| 2004/0224094 | A1* | 11/2004 | Lee et al. .................... | 427/387 |
| 2004/0224537 | A1* | 11/2004 | Lee et al. .................... | 438/782 |
| 2005/0026443 | A1* | 2/2005 | Goo et al. .................... | 438/694 |
| 2005/0093042 | A1* | 5/2005 | Nakazawa et al. .......... | 257/295 |
| 2005/0157549 | A1* | 7/2005 | Mokhlesi et al. ......... | 365/185.01 |
| 2006/0084243 | A1* | 4/2006 | Zhang et al. ................ | 438/478 |
| 2006/0194432 | A1* | 8/2006 | Park et al. ................... | 438/672 |
| 2006/0205202 | A1* | 9/2006 | Chung ......................... | 438/624 |
| 2006/0231900 | A1* | 10/2006 | Lee et al. .................... | 257/368 |
| 2006/0245245 | A1* | 11/2006 | Mokhlesi et al. ......... | 365/185.01 |
| 2007/0025145 | A1* | 2/2007 | Mokhlesi et al. ......... | 365/185.01 |
| 2007/0034517 | A1 | 2/2007 | Tsao et al. | |
| 2007/0117412 | A1* | 5/2007 | Goo et al. .................... | 438/787 |
| 2007/0215950 | A1* | 9/2007 | Aoyama ...................... | 257/369 |
| 2007/0252199 | A1* | 11/2007 | Chung et al. ................ | 257/330 |
| 2009/0004849 | A1* | 1/2009 | Eun ............................. | 438/654 |
| 2009/0227091 | A1* | 9/2009 | Sonsky et al. .............. | 438/478 |

FOREIGN PATENT DOCUMENTS

| | | | |
|---|---|---|---|
| KR | 10-2003-0004930 | | 1/2003 |
| KR | 2005053245 A | * | 6/2005 |
| KR | 10-2005-0067559 | | 7/2005 |

\* cited by examiner

*Primary Examiner* — David E Graybill
(74) *Attorney, Agent, or Firm* — Marshall, Gerstein & Borun LLP (57) ABSTRACT

In a method for fabricating an inter dielectric layer in semiconductor device, a primary liner HDP oxide layer is formed by supplying a high density plasma (HDP) deposition source to a bit line stack formed on a semiconductor substrate. A high density plasma (HDP) deposition source is supplied to the bit line stack to form a primary liner HDP oxide layer. The primary liner HDP oxide layer is etched to a predetermined depth to form a secondary liner HDP oxide layer. An interlayer dielectric layer is formed to fill the areas defined by the bit line stack where the secondary liner HDP oxide layer is located.

9 Claims, 7 Drawing Sheets

METHOD FOR FABRICATING AN INTER DIELECTRIC LAYER IN SEMICONDUCTOR DEVICE

CROSS-REFERENCE TO RELATED APPLICATION

The priority of Korean patent application number 10-2007-0064760, filed on Jun. 28, 2007, which is incorporated by reference in its entirety, is claimed.

BACKGROUND OF THE INVENTION

The invention relates to a semiconductor device, and more particularly, to a method for fabricating an inter dielectric layer in a semiconductor device.

With development of semiconductor device fabrication technology, the critical dimension (CD) of bit line stacks is rapidly decreasing. As the CD of the bit line stacks decreases, a space defined between the bit line stacks also decreases. Therefore, there is a limitation in a high density plasma (HDP) process used as a gap filling method. One example is a bending phenomenon in which a bit line stack becomes bent.

Figure 1:
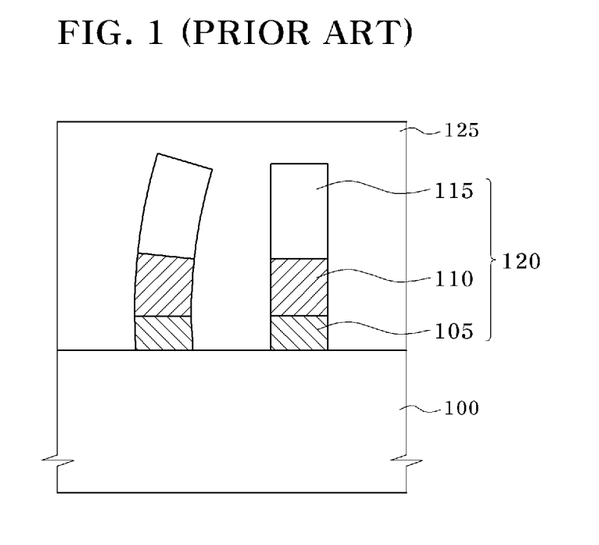
FIG. 1 illustrates a cross-sectional view of a conventional bit line stack.
Figure 2:
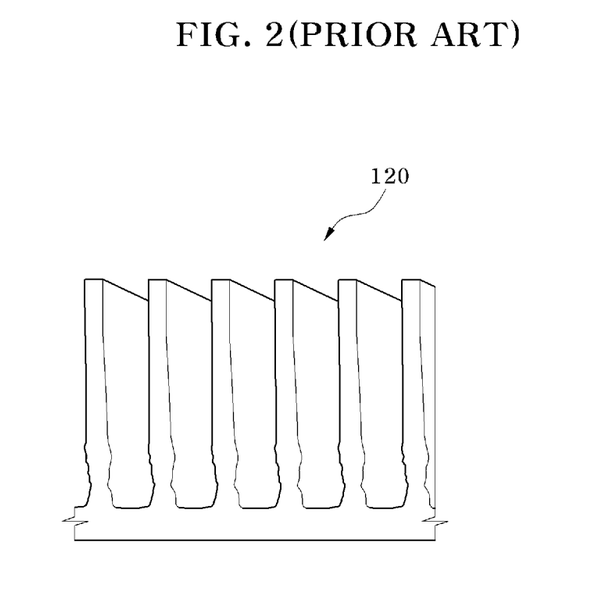
FIG. 2 illustrates a scanning electron micrograph (SEM) of bit lines having variable heights.
Figure 3:
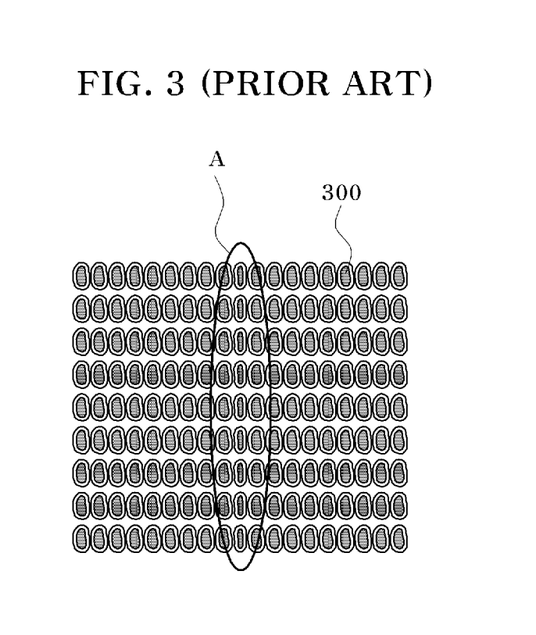
FIG. 3 illustrates an SEM of a defect in which a storage node contact is not formed.

FIG. 1 illustrates a cross-sectional view of a conventional bit line stack, FIG. 2 illustrates a scanning electron micrograph (SEM) of bit lines having a high aspect ratio, and FIG. 3 illustrates a SEM of a defect in which a storage node contact is not formed.

Referring to FIG. 1, bit line stacks 120, including barrier metal patterns 105, conductive patterns 110, and hard mask patterns 115, are formed on a semiconductor substrate 100, and an interlayer dielectric layer 125 is formed to fill the areas surrounding the bit line stacks 120. The interlayer dielectric layer 125 is formed using an HDP process. However, when the interlayer dielectric layer is formed using the HDP process, a bending phenomenon may occur so that a given bit line stack 120 is bent. The bending phenomenon may occur when unequal attraction is applied to one of the bit stacks 120 by a difference in an amount of charges applied to the left and right side of the bit line stack 120 due to plasma generated during the HDP process, or it may occur as a result of a damage caused by plasma. Due to limitations of the fabricating process, a bit line stack in a 50 nm device is filled using a flowable layer. Although the flowable layer was developed as a material for device isolation, many studies have been conducted to use the flowable layer in a process requiring a gap fill, such as an isolation layer a gate stack, or a bit line stack.

However, the bending phenomenon occurs even though the gap fill process is performed using the flowable layer. As illustrated in FIG. 2, the bit line stacks 120 have a large aspect ratio (i.e., height to width ratio), and the flowable layer is softer than an HDP oxide layer. Therefore, when the flowable layer is used, it does not endure a subsequent thermal process and a self align contact (SAC) process, and the bit line stacks 120 may be bent to one side due to an unequal attraction. When a subsequent process is performed and the bit line stack 120 is bent in one direction, a storage node contact hole 300 may not be formed, as indicated by a reference symbol "A" in FIG. 3.

SUMMARY OF THE INVENTION

In one embodiment, a method for fabricating an inter dielectric layer in semiconductor device includes: forming a primary liner HDP oxide layer on a bit line stack formed over a semiconductor substrate by supplying a high density plasma (HDP) deposition source to the bit line stack; forming a secondary liner HDP oxide layer by etching the primary liner HDP oxide layer to a predetermined thickness; and forming an interlayer dielectric layer to fill areas defined by the bit line stack where the secondary liner HDP oxide layer is formed.

The method may further include preheating the bit line stack before forming the primary liner HDP oxide layer.

The preheating of the bit line stack may include: loading the semiconductor substrate into an HDP chamber, and applying a predetermined power to the HDP chamber while supplying oxygen ($O_2$) gas, argon (Ar) gas, and helium (He) gas into the HDP chamber.

The HDP deposition source may include a source gas containing silane ($SiH_4$) gas and oxygen ($O_2$) gas, and an additive gas containing helium (He) gas.

The forming of the primary liner HDP oxide layer may include maintaining a bottom bias at less than 500 W.

The primary liner HDP oxide layer may be formed to a thickness ranging from about 500 Å to about 600 Å.

The secondary liner HDP oxide layer may be formed using a fluorine-based etch gas.

The secondary liner HDP oxide layer may be formed by etching the primary liner HDP oxide layer to a thickness ranging from about 150 Å to about 190 Å.

The forming of the interlayer dielectric layer may include: coating a flowable layer including a solvent on the semiconductor substrate where the secondary liner HDP oxide layer; evaporating the solvent by heating the flowable layer to a temperature between about 130° C. to about 150° C.; and performing a curing process on the flowable layer to form an oxide layer.

The flowable layer may include a spin-on dielectric (SOD) layer containing polysilizane (PSZ).

The curing process may be performed for about 1 hour while supplying 1 L of hydrogen ($H_2$) gas and 2 L of oxygen ($O_2$) gas at a temperature between about 450° C. and about 550° C.

DESCRIPTION OF SPECIFIC EMBODIMENTS

Hereinafter, a method for fabricating an inter dielectric layer in semiconductor device in accordance with the invention will be described in detail with reference to the accompanying drawings.

FIGS. 4 to 9 illustrate a method for fabricating an inter dielectric layer in semiconductor device according to an embodiment of the invention.

Figure 4:
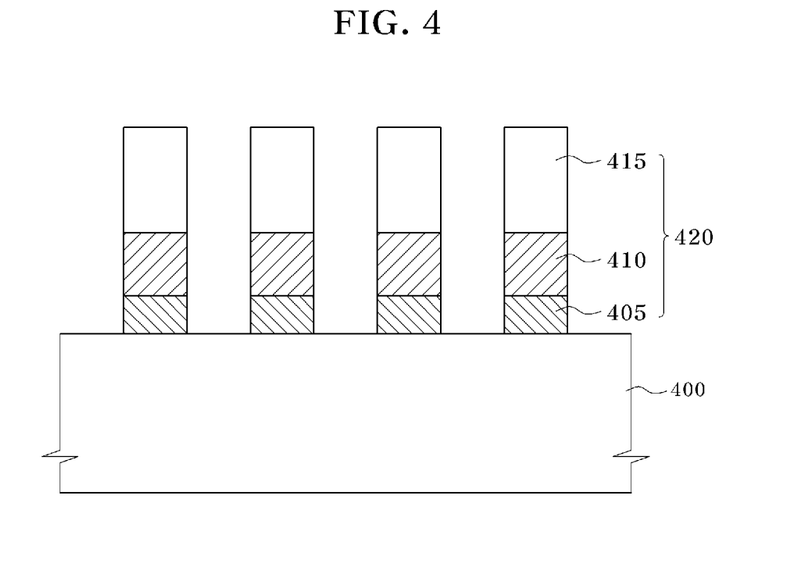
FIGS. 4 to 9 illustrate a method for fabricating an inter dielectric layer in semiconductor device according to an embodiment of the invention.

Referring to FIG. 4, a bit line stack 420 is formed on a semiconductor substrate 400.

Specifically, a barrier metal layer, a conductive layer for bit lines, and a hard mask layer are deposited on the semiconductor substrate 400. The barrier metal layer may be formed of titanium (Ti), the conductive layer for the bit lines may be formed of tungsten (W), and the hard mask layer may be formed of nitride. At this point, a lower structure (not shown) including a word line has been already formed on the semiconductor substrate 400.

The hard mask layer is patterned to form hard mask patterns 415. The conductive layer for the bit lines and the barrier metal layer are etched using the hard mask patterns 415 as an etch mask to form barrier metal patterns 405 and conductive patterns 410 for the bit lines. The barrier metal patterns 405, the conductive patterns 410 for the bit lines, and the hard mask patterns 415 constitute the bit line stack 420.

Figure 5:
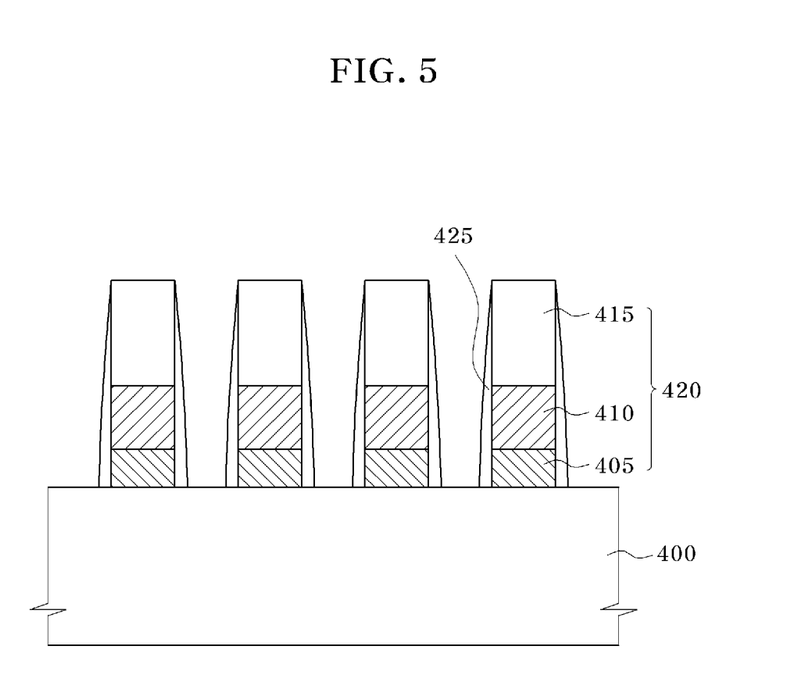

Referring to FIG. 5, bit line spacers 425 are formed on both sides of the bit line stack 420. The forming of the bit line spacers 425 may include depositing a spacer layer on the semiconductor substrate 400 where the bit line stack 420 is formed, and performing an etch-back process on the deposited spacer layer.

Figure 6:
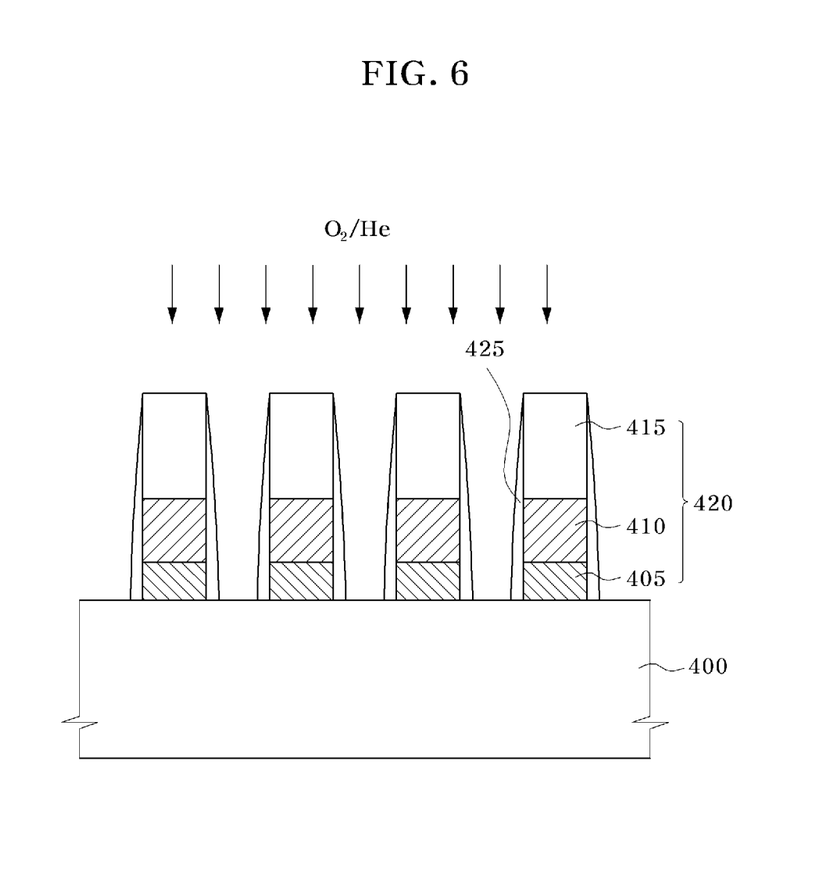
Figure 10:
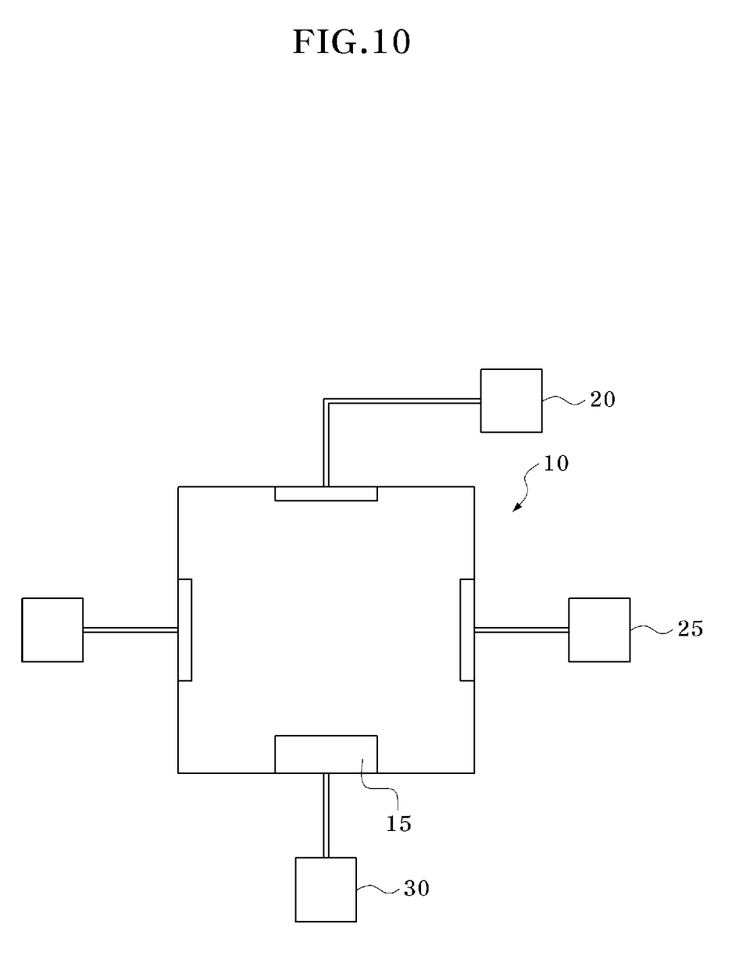
FIG. 10 illustrates a block diagram of an HDP chamber.

Referring to FIGS. 6 and 10, the bit line stack 420 where the bit line spacers 425 are formed is preheated in an atmosphere including oxygen ($O_2$) and helium (He).

More specifically, the semiconductor substrate 400 is loaded in a stage 15 of an HDP chamber 10 illustrated in FIG. 10. Oxygen ($O_2$) gas and argon (Ar) gas are supplied into the HDP chamber 10 as a source gas, and helium (He) gas is supplied as an additive gas. The preheating process is performed for about 20-30 seconds by supplying a predetermined power. The $O_2$ gas is supplied at a flow rate ranging from about 50 sccm to about 150 sccm, the Ar gas is supplied at a flow rate ranging from about 40 sccm to about 50 sccm, and the He gas is supplied at a flow rate ranging from about 200 sccm to about 300 sccm. At this point, the He gas is additionally supplied from the top of the HDP chamber 10 at a flow rate ranging from about 200 sccm to about 300 sccm. As a source power for generating plasma, a top bias 20 is applied in the range from about 4,500 W to about 5,500 W, a side bias 25 is applied in the range from about 3,500 W to about 4,500 W, and no bottom bias 30 is applied.

Figure 7:
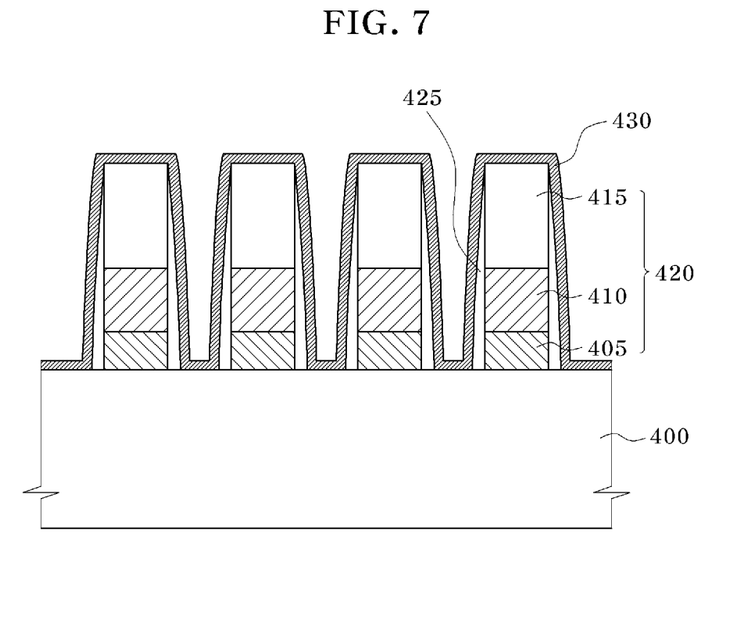

Referring to FIGS. 7 and 10, a primary liner HDP oxide layer 430 is formed on the bit line stack 420.

The primary liner HDP oxide layer 430 is formed by supplying an HDP deposition source into the HDP chamber 10 where the preheating process has been performed. The HDP deposition source contains a source gas including silane ($SiH_4$) gas and $O_2$ gas, and an additive gas including He gas. The $O_2$ gas as the HDP deposition source is supplied at a flow rate ranging from about 100 sccm to about 120 sccm. The silane ($SiH_4$) gas is supplied from the top of the HDP chamber 10 at a flow rate ranging from about 10 sccm to about 50 sccm and is supplied from the side of the HDP chamber 10 at a flow rate ranging from about 50 sccm to about 150 sccm. At this point, as the source power for generating plasma, the top bias 20 is applied in the range from about 4,500 W to about 5,500 W and the side bias 25 is applied in the range from about 2,500 W to about 3,500 W. In addition, the bottom bias 30 is applied in the range from about 450 W to about 500 W. The primary liner HDP oxide layer 430 is deposited on the bit line stack 420 to a thickness ranging from about 500 Å to about 600 Å by using the HDP deposition source and the bias applied to the HDP chamber.

Meanwhile, a He cooling process is performed on the back side of the semiconductor substrate 400, such that an overall temperature of the semiconductor substrate 400 is adjusted to below 350° C. during the process of forming the primary liner HDP oxide layer 430. Therefore, a gate insulating layer in the middle of the lower structure is prevented from being damaged by the high temperature plasma. Further, in forming the primary liner HDP oxide layer 430, a bending phenomenon of the bit line stack 420 due to plasma charge can be minimized by maintaining the bottom bias to below 500 W. Accordingly, it is possible to prevent the bending phenomenon caused by unstable charging, which has been generated in the bit line stack due to the high bias during the process of depositing the HDP oxide layer under the bottom bias higher than 1,500 W.

Figure 8:
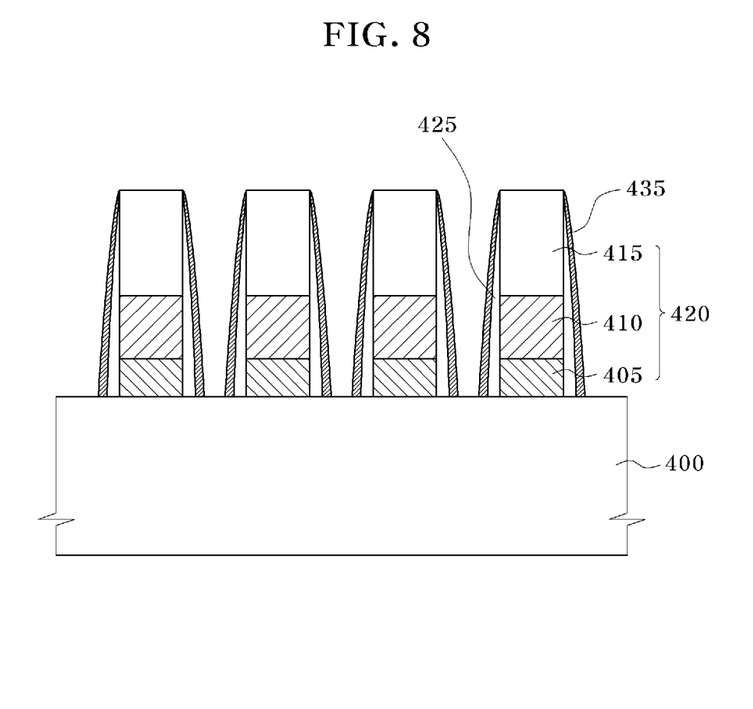

Referring to FIGS. 8 and 10, the primary liner HDP oxide layer 430 is etched by a predetermined thickness to form a sidewall spacer 435.

More specifically, an etch gas is supplied into the HDP chamber 10 in which the primary liner HDP oxide layer 430 has been formed. A fluorine-based gas, e.g., $NF_3$ gas, is used as the etch gas. In addition to the $NF_3$ gas, $H_2$ gas and He gas are supplied. The $NF_3$ gas is supplied at a flow rate ranging from about 100 sccm to about 200 sccm. The $H_2$ gas is supplied at a flow rate ranging from about 100 sccm to about 200 sccm. The He gas is supplied from the top of the HDP chamber 10 at a flow rate ranging from about 50 sccm to about 70 sccm. In addition, the He gas is also supplied from the side of the HDP chamber 10 at a flow rate ranging from about 50 sccm to about 70 sccm. The primary liner HDP oxide layer 430 is etched to a thickness ranging from about 150 Å to about 190 Å by the etching process, thereby forming the sidewall spacer 435. After the etching process, the sidewall spacer 435 remains only at the both sides of the bit line stack 420.

Figure 9:
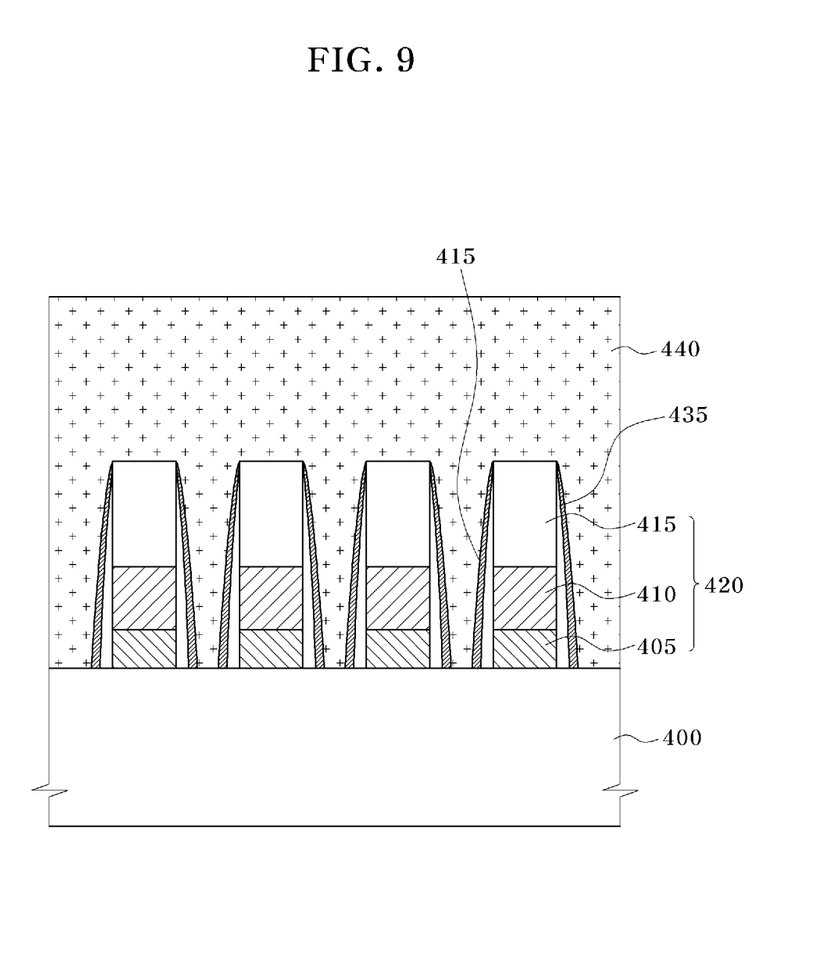

Referring to FIG. 9, an interlayer dielectric layer 440 is formed to fill the area between adjacent bit line stacks 420 where the sidewall spacer 435 is formed.

The interlayer dielectric layer 440 filling the bit line stack 420 is formed by coating a flowable spin-on dielectric (SOD) layer using a spin coating process. Since the SOD layer has excellent gap-fill characteristics, it is used as a gap-fill material in places where the gap between patterns is narrow. Polysilazane (PSZ) may be used as the SOD.

A solvent in the gap-fill material is evaporated by maintaining the flowable SOD layer in a chuck at a high temperature range between about 130° C. and about 150° C. for about 150-200 seconds. Then, a curing process is performed on the SOD layer. The curing process is performed for about 1 hour while supplying 1 L of $H_2$ gas and 2 L of $O_2$ gas at a temperature between about 450° C. and about 550° C. Due to the curing process, the SOD layer is oxidized to form an oxide layer as the interlayer dielectric layer 440. Then, the interlayer dielectric layer 440 is planarized using a planarization process, e.g., a chemical mechanical polishing (CMP) process.

According to the embodiments of the invention, the bit line stack is covered with the liner HDP oxide layer and then is filled with the SOD layer, thereby preventing the bending phenomenon of the bit line stack.

The embodiments of the invention have been disclosed above for illustrative purposes. Those skilled in the art will appreciate that various modifications, additions and substitutions are possible, without departing from the scope and spirit of the invention as disclosed in the accompanying claims.

What is claimed is:

1. A method for fabricating an inter dielectric layer in a semiconductor device, comprising:
    forming a bit line stack over a semiconductor substrate, the bit line stack comprising a barrier metal pattern, a conductive pattern, and a hard mask pattern;
    forming bit line spacers on both sides of the bit line stack to expose a top surface of the hard mask pattern;
    forming sidewall spacers on the bit line spacers by performing a high density plasma (HDP) process;
    filling an area defined by adjacent bit line stacks with a flowable spin on dielectric (SOD) layer; and, curing the flowable SOD layer to form the inter dielectric layer.

2. The method of claim 1, wherein forming the sidewall spacers comprises:
   forming a primary liner oxide layer by supplying a high density plasma (HDP) deposition source on the bit line stack, bit line spacers, and an exposed surface of the semiconductor substrate; and
   etching the primary liner oxide layer to form the sidewall spacers on both sides of the bit line spacers, wherein the sidewall spacers expose a top surface of the bit line stack and the semiconductor substrate.

3. The method of claim 1, wherein the SOD layer comprises polysilazane (PSZ).

4. The method of claim 1, wherein curing the SOD layer comprises
   curing the SOD layer for about 1 hour while supplying 1 L of hydrogen ($H_2$) gas and 2 L of oxygen ($O_2$) gas at a temperature between about 450° C. and about 550° C.

5. The method of claim 2, further comprising preheating the bit line stack before forming the primary liner oxide layer.

6. The method of claim 5, wherein preheating the bit line stack comprises:
   loading the semiconductor substrate into an HDP chamber; and
   applying a predetermined power to the HDP chamber while supplying oxygen ($O_2$) gas, argon (Ar) gas, and helium (He) gas into the HDP chamber.

7. The method of claim 2, wherein the HDP deposition source comprises a source gas comprising silane ($SiH_4$) gas, oxygen ($O_2$) gas, and an additive gas comprising helium (He) gas.

8. The method of claim 4, wherein, prior to the step of curing the SOD layer, heating the SOD layer at a temperature between about 130° C. and about 150° C. to evaporate a solvent in the SOD layer.

9. The method of claim 2 further comprising performing a Helium (He) cooling process on a backside of the semiconductor substrate such that the overall temperature of the semiconductor substrate is adjusted to below 350° C. during the process of forming the primary liner oxide layer.

* * * * *